United States Patent
Milne et al.

(10) Patent No.: US 10,616,684 B2
(45) Date of Patent: Apr. 7, 2020

(54) ENVIRONMENTAL SENSING FOR A UNIQUE PORTABLE SPEAKER LISTENING EXPERIENCE

(71) Applicant: Sony Corporation, Tokyo, OT (JP)

(72) Inventors: James R. Milne, Ramona, CA (US); Allison Joi Burgueno, Oceanside, CA (US); Keith Resch, San Diego, CA (US); Gregory Peter Carlsson, Santee, CA (US)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/006,316

(22) Filed: Jun. 12, 2018

(65) Prior Publication Data
US 2019/0356985 A1 Nov. 21, 2019

Related U.S. Application Data

(60) Provisional application No. 62/671,795, filed on May 15, 2018.

(51) Int. Cl.
*H04R 5/02* (2006.01)
*H04R 5/04* (2006.01)
*H04S 3/00* (2006.01)
*H04S 7/00* (2006.01)
*H03G 5/16* (2006.01)

(52) U.S. Cl.
CPC .............. *H04R 5/02* (2013.01); *H03G 5/165* (2013.01); *H04R 5/04* (2013.01); *H04S 3/008* (2013.01); *H04S 7/303* (2013.01); *H04S 2400/01* (2013.01)

(58) Field of Classification Search
CPC .... H04R 29/00; H04R 29/001; H04R 29/002; H04R 29/003; H04R 29/008; H04R 3/04; H04R 3/12; H04R 5/02; H04R 5/04; H04S 7/00; H04S 7/301; H04S 7/302; H04S 2400/01
USPC ...... 381/300, 304, 305, 59, 96, 104–109, 27
See application file for complete search history.

(56) References Cited

U.S. PATENT DOCUMENTS

| | | | |
|---|---|---|---|
| 5,872,852 A | | 2/1999 | Dougherty |
| 5,907,622 A | * | 5/1999 | Dougherty ............... H03G 3/32 381/108 |
| 6,760,451 B1 | | 7/2004 | Craven et al. |

(Continued)

FOREIGN PATENT DOCUMENTS

| | | |
|---|---|---|
| EP | 2043381 A2 | 4/2009 |
| JP | H11113081 A | 4/1999 |

(Continued)

OTHER PUBLICATIONS

James R. Milne, Allison Joi Burgueno, Gregory Peter Carlsson, Keith Resch, "Capacitive Environmental Sensing for a Unique Portable Speaker Listening Experience", file history of related U.S. Appl. No. 16/175,553, filed Oct. 30, 2018.

(Continued)

*Primary Examiner* — Xu Mei
(74) *Attorney, Agent, or Firm* — John L. Rogitz

(57) ABSTRACT

A networked speaker system automatically adjusts certain audio speaker system settings based on whether the system is inside a building or has been moved outside. Also, techniques are described for adjusting speaker driver direction based on walls or other barriers in a room or based on the location of a listener.

7 Claims, 9 Drawing Sheets

NETWORKED-SPEAKER BLOCK DIAGRAM

(56) References Cited

U.S. PATENT DOCUMENTS

| | | | |
|---|---|---|---|
| 7,106,221 B2 | 9/2006 | Horton et al. | |
| 7,853,022 B2 | 12/2010 | Thompson et al. | |
| 7,929,708 B2 | 4/2011 | Reams et al. | |
| 8,014,554 B2 | 9/2011 | Xu et al. | |
| 8,155,329 B1* | 4/2012 | Silaika | H03G 3/341 340/539.15 |
| 8,436,758 B2 | 5/2013 | McLaughlin et al. | |
| 8,437,432 B2 | 5/2013 | McLaughlin et al. | |
| 8,577,048 B2 | 11/2013 | Chaikin et al. | |
| 8,677,224 B2 | 3/2014 | McLaughlin et al. | |
| 8,870,334 B2 | 10/2014 | Nakamaki | |
| 8,880,205 B2 | 11/2014 | Chung | |
| 9,054,790 B2 | 6/2015 | McLaughlin et al. | |
| 9,288,597 B2 | 3/2016 | Carlsson et al. | |
| 9,369,801 B2 | 6/2016 | Carlsson et al. | |
| 9,377,941 B2* | 6/2016 | Nguyen | G06K 9/0057 |
| 9,402,145 B2 | 7/2016 | Carlsson et al. | |
| 9,426,551 B2 | 8/2016 | Carlsson et al. | |
| 9,516,444 B2 | 12/2016 | Riggi et al. | |
| 9,560,449 B2 | 1/2017 | Carlsson et al. | |
| 9,648,438 B1 | 5/2017 | Petrov | |
| 9,693,169 B1 | 6/2017 | Carlsson et al. | |
| 9,826,332 B2 | 11/2017 | Milne et al. | |
| 9,854,362 B1 | 12/2017 | Milne et al. | |
| 9,866,986 B2 | 1/2018 | Milne et al. | |
| 9,924,286 B1 | 3/2018 | Milne et al. | |
| 9,924,291 B2 | 3/2018 | Milne et al. | |
| 10,292,000 B1* | 5/2019 | Milne | H04S 7/301 |
| 2003/0119523 A1* | 6/2003 | Bulthuis | H04S 7/301 455/456.1 |
| 2004/0184623 A1 | 9/2004 | Johannsen et al. | |
| 2006/0106620 A1 | 5/2006 | Thompson et al. | |
| 2007/0032895 A1 | 2/2007 | Nackvi et al. | |
| 2007/0297519 A1 | 12/2007 | Thompson et al. | |
| 2008/0279307 A1 | 11/2008 | Gaffney et al. | |
| 2009/0060204 A1 | 3/2009 | Reams et al. | |
| 2009/0110218 A1 | 4/2009 | Swain | |
| 2009/0136075 A1 | 5/2009 | Meyer | |
| 2011/0091055 A1* | 4/2011 | LeBlanc | H04S 7/301 381/303 |
| 2011/0116642 A1 | 5/2011 | Hall et al. | |
| 2012/0069868 A1 | 3/2012 | McLaughlin et al. | |
| 2012/0120874 A1 | 5/2012 | McLaughlin et al. | |
| 2014/0079241 A1* | 3/2014 | Chan | H04W 4/21 381/77 |
| 2014/0140539 A1 | 5/2014 | Urup | |
| 2014/0219483 A1* | 8/2014 | Hong | H04R 5/02 381/307 |
| 2014/0254811 A1 | 9/2014 | Takeda et al. | |
| 2014/0334628 A1* | 11/2014 | Lee | H04R 1/00 381/59 |
| 2015/0139439 A1 | 5/2015 | Norris et al. | |
| 2015/0163616 A1* | 6/2015 | Chatterjee | H04S 7/301 381/303 |
| 2015/0208187 A1* | 7/2015 | Carlsson | H04R 3/12 381/79 |
| 2015/0222977 A1 | 8/2015 | Angel | |
| 2015/0319540 A1 | 11/2015 | Rubinstein et al. | |
| 2016/0021481 A1 | 1/2016 | Johnson et al. | |
| 2016/0165337 A1 | 6/2016 | Trestain et al. | |
| 2017/0060524 A1* | 3/2017 | Daly | G06F 3/165 |
| 2017/0162181 A1 | 6/2017 | Watanabe et al. | |
| 2017/0280265 A1 | 9/2017 | Po | |
| 2018/0054687 A1 | 2/2018 | Sheen | |
| 2018/0115825 A1 | 4/2018 | Milne et al. | |

FOREIGN PATENT DOCUMENTS

| | | |
|---|---|---|
| KR | 20090045762 A | 5/2009 |
| KR | 101849910 B1 | 4/2018 |

OTHER PUBLICATIONS

James R. Milne, Allison Joi Burgueno, Gregory Peter Carlsson, Keith Resch, "Automatically Movable Speaker to Track Listener or Optimize Sound Performance", file history of related U.S. Appl. No. 16/123,188, filed Sep. 6, 2018.

James R. Milne, Allison Joi Burgueno, Gregory Peter Carlsson, Keith Resch, "Frequency Sweep for a Unique Portable Speaker Listening Experience", related U.S. Appl. No. 16/025,874, Non-Final Office Action dated Jan. 18, 2019.

James R. Milne, Allison Joi Burgueno, Gregory Peter Carlsson, Keith Resch, "Frequency Sweep for a Unique Portable Speaker Listening Experience", related U.S. Appl. No. 16/025,874, Applicant's response to Non-Final Office Action filed Jan. 24, 2019.

"Swamp—24X8—Sonnex Multiroom Audio System", CrestroCrestron Electronics, Inc., Jul. 28, 2014.

"Using LAUD with Accelerometers", retrieved form http://www.libinst.com on Jun. 12, 2018.

Michael Brown, "Soundcast VG7 Outdoor Bluetooth Speaker Review", TechHive (from IDG), Jun. 21, 2017.

Robert W. Reams, "N-Channel Rendering: Workable 3-D Audio for 4kTV", AES 135, New York City, 2013.

James R. Milne, Allison Joi Burgueno, Gregory Peter Carlsson, Keith Resch, "Frequency Sweep for a Unique Portable Speaker Listening Experience", file history of related U.S. Appl. No. 16/025,874, filed Jul. 2, 2018.

Milne et al., "Automatically Movable Speaker to Track Listener or Optimize Sound Performance", related U.S. Appl. No. 16/123,188, Non-Final Office Action dated Sep. 13, 2019.

Milne et al., "Automatically Movable Speaker to Track Listener or Optimize Sound Performance", related U.S. Appl. No. 16/123,188, Applicant's response to Non-Final Office Action filed Oct. 1, 2019.

Milne et al., "Automatically Movable Speaker to Track LIstener or Optimize Sound Performance", related U.S. Appl. No. 16/123,188, Final Office Action dated Oct. 22, 2019.

Milne et al., "Automatically Movable Speaker to Track Listener or Optimize Sound Performance", related U.S. Appl. No. 16/123,188, Final Office Action response filed Oct. 28, 2019.

* cited by examiner

NETWORKED-SPEAKER BLOCK DIAGRAM

SCENARIO 2

ENVIRONMENTAL SENSING FOR A UNIQUE PORTABLE SPEAKER LISTENING EXPERIENCE

FIELD

The present application relates generally to networked speaker systems.

BACKGROUND

U.S. Pat. Nos. 9,288,597, 9,560,449, 9,866,986, 9,402,145, 9,369,801, 9,426,551, 9,826,332, 9,924,291, 9,693,169, 9,854,362, 9,924,286, and USPP 2018/115,825, owned by the present assignee and all incorporated herein by reference, teach techniques related to audio speaker systems and more particularly to wirelessly networked audio speaker systems. By wirelessly networking speakers in a system, flexibility is enhanced, because users can easily move speakers to locations in buildings as they desire and otherwise configure the audio system setup without the nuisance of wiring.

SUMMARY

As understood herein, portable wireless speakers within a building can be easily moved outside by users for entertainment and other purposes. As further understood herein, it would convenient for the user if the audio configurations of such systems were automatically established depending on the new location/orientation of the various system speakers. System speakers include audio speakers per se as well as sound bars, speakers on display devices such as TVs, etc.

Accordingly, a device includes at least one computer medium that is not a transitory signal and that in turn includes instructions executable by at least one processor to identify whether at least a first audio speaker is located inside a building or outdoor. The instructions are executable to, responsive to identifying that the first audio speaker is located inside a building, establish a first value of at least a first audio setting of the speaker. The instructions are further executable to, responsive to identifying that the first audio speaker is located outdoor, establish a second value of the first audio setting of the speaker.

In examples, the first audio setting can include a speaker system channel configuration, a compression setting, ambient sound attenuation, extra bass, equalization (EQ). Combinations of settings may be used, and their values established according to whether the speaker is indoors or outdoors.

In non-limiting examples, the instructions may be executable to, responsive to identifying that the first audio speaker is located inside a building, identify a location of at least one listener, and establish a speaker driver orientation such that a center channel of N-channel audio produced by plural speakers in the building is directed toward the listener. In other examples, the instructions may be executable to, responsive to identifying that the first audio speaker is located inside a building, identify a location of at least one barrier in the building, and establish a speaker driver orientation such that a center channel of N-channel audio produced by plural speakers in the building is directed away from the barrier.

In another aspect, a method includes receiving indication of whether at least a first audio speaker is located inside a building or outdoors, and responsive to the indication, establishing an audio configuration of the first speaker.

In another aspect, an audio speaker system includes at least a first audio speaker associated with a first speaker driver, and at least one processor configured with instructions for establishing a first audio configuration of the first audio speaker responsive to receiving indication that the first audio speaker is located inside a building. The instructions also are executable for establishing a second audio configuration of the first audio speaker responsive to receiving indication that the first audio speaker is located outdoors.

The details of the present application, both as to its structure and operation, can be best understood in reference to the accompanying drawings, in which like reference numerals refer to like parts, and in which:

DETAILED DESCRIPTION

Figure 1:
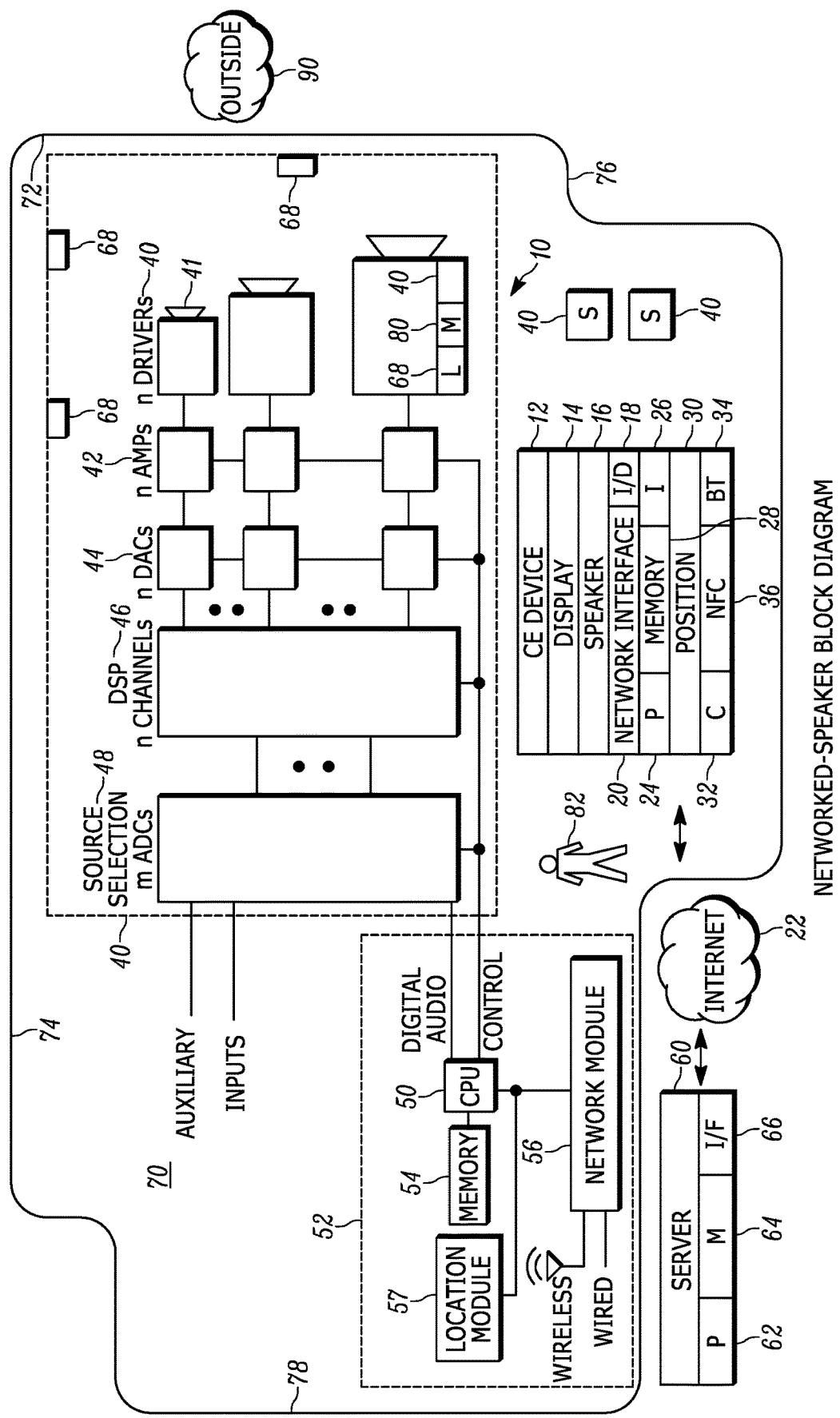
FIG. 1 is a block diagram of an example wireless audio speaker system.

In addition to the instant disclosure, further details may use Decawave's ultra-wide band (UWB) techniques disclosed in one or more of the following location determination documents, all of which are incorporated herein by reference: U.S. Pat. Nos. 9,054,790; 8,870,334; 8,677,224; 8,437,432; 8,436,758; and USPPs 2008/0279307; 2012/0069868; 2012/0120874. In addition to the instant disclosure, further details on aspects of the below-described rendering including up-mixing and down rendering may use the techniques in any one or more of the following rendering documents, all of which are incorporated herein by reference: U.S. Pat. Nos. 7,929,708; 7,853,022; USPP 2007/0297519; USPP 2009/0060204; USPP 2006/0106620; and Reams, "N-Channel Rendering: Workable 3-D Audio for 4 kTV", AES 135 White paper, New York City 2013.

This disclosure relates generally to computer ecosystems including aspects of multiple audio speaker ecosystems. A system herein may include server and client components, connected over a network such that data may be exchanged between the client and server components. The client components may include one or more computing devices that have audio speakers including audio speaker assemblies per se but also including speaker-bearing devices such as portable televisions (e.g. smart TVs, Internet-enabled TVs), portable computers such as laptops and tablet computers, and other mobile devices including smart phones and additional examples discussed below. These client devices may operate with a variety of operating environments. For example, some of the client computers may employ, as examples, operating systems from Microsoft, or a Unix operating system, or operating systems produced by Apple Computer or Google.

These operating environments may be used to execute one or more browsing programs, such as a browser made by Microsoft or Google or Mozilla or other browser program that can access web applications hosted by the Internet servers discussed below.

Servers may include one or more processors executing instructions that configure the servers to receive and transmit data over a network such as the Internet. Or, a client and server can be connected over a local intranet or a virtual private network.

Information may be exchanged over a network between the clients and servers. To this end and for security, servers and/or clients can include firewalls, load balancers, temporary storages, and proxies, and other network infrastructure for reliability and security. One or more servers may form an apparatus that implement methods of providing a secure community such as an online social website to network members.

As used herein, instructions refer to computer-implemented steps for processing information in the system. Instructions can be implemented in software, firmware or hardware and include any type of programmed step undertaken by components of the system.

A processor may be any conventional general-purpose single- or multi-chip processor that can execute logic by means of various lines such as address lines, data lines, and control lines and registers and shift registers. A processor may be implemented by a digital signal processor (DSP), for example.

Software modules described by way of the flow charts and user interfaces herein can include various sub-routines, procedures, etc. Without limiting the disclosure, logic stated to be executed by a particular module can be redistributed to other software modules and/or combined together in a single module and/or made available in a shareable library.

Present principles described herein can be implemented as hardware, software, firmware, or combinations thereof; hence, illustrative components, blocks, modules, circuits, and steps are set forth in terms of their functionality.

Further to what has been alluded to above, logical blocks, modules, and circuits described below can be implemented or performed with a general-purpose processor, a digital signal processor (DSP), a field programmable gate array (FPGA) or other programmable logic device such as an application specific integrated circuit (ASIC), discrete gate or transistor logic, discrete hardware components, or any combination thereof designed to perform the functions described herein. A processor can be implemented by a controller or state machine or a combination of computing devices.

The functions and methods described below, when implemented in software, can be written in an appropriate language such as but not limited to C # or C++, and can be stored on or transmitted through a computer-readable storage medium such as a random access memory (RAM), read-only memory (ROM), electrically erasable programmable read-only memory (EEPROM), compact disk read-only memory (CD-ROM) or other optical disk storage such as digital versatile disc (DVD), magnetic disk storage or other magnetic storage devices including removable thumb drives, etc. A connection may establish a computer-readable medium. Such connections can include, as examples, hard-wired cables including fiber optic and coaxial wires and digital subscriber line (DSL) and twisted pair wires.

Components included in one embodiment can be used in other embodiments in any appropriate combination. For example, any of the various components described herein and/or depicted in the Figures may be combined, interchanged or excluded from other embodiments.

"A system having at least one of A, B, and C" (likewise "a system having at least one of A, B, or C" and "a system having at least one of A, B, C") includes systems that have A alone, B alone, C alone, A and B together, A and C together, B and C together, and/or A, B, and C together, etc.

Now specifically referring to FIG. 1, an example system 10 is shown, which may include one or more of the example devices mentioned above and described further below in accordance with present principles. The first of the example devices included in the system 10 is an example consumer electronics (CE) device 12. The CE device 12 may be, e.g., a computerized Internet enabled ("smart") telephone, a tablet computer, a notebook computer, a wearable computerized device such as e.g. computerized Internet-enabled watch, a computerized Internet-enabled bracelet, other computerized Internet-enabled devices, a computerized Internet-enabled music player, computerized Internet-enabled head phones, a computerized Internet-enabled implantable device such as an implantable skin device, etc., and even e.g. a computerized Internet-enabled television (TV). Regardless, it is to be understood that the CE device 12 is configured to undertake present principles (e.g. communicate with other devices to undertake present principles, execute the logic described herein, and perform any other functions and/or operations described herein).

Accordingly, to undertake such principles the CE device 12 can be established by some or all of the components shown in FIG. 1. For example, the CE device 12 can include one or more touch-enabled displays 14, one or more speakers 16 for outputting audio in accordance with present principles, and at least one additional input device 18 such as e.g. an audio receiver/microphone for e.g. entering audible commands to the CE device control the CE device 12. The example CE device 12 may also include one or more network interfaces 20 for communication over at least one network 22 such as the Internet, an WAN, an LAN, etc. under control of one or more processors 24. It is to be understood that the processor 24 controls the CE device 12 to undertake present principles, including the other elements of the CE device 12 described herein such as e.g. controlling the display 14 to present images thereon and receiving input therefrom. Furthermore, note the network interface 20 may be, e.g., a wired or wireless modem or router, or other appropriate interface such as, e.g., a wireless telephony transceiver, Wi-Fi transceiver, etc.

In addition to the foregoing, the CE device 12 may also include one or more input ports 26 such as, e.g., a USB port to physically connect (e.g. using a wired connection) to another CE device and/or a headphone port to connect headphones to the CE device 12 for presentation of audio from the CE device 12 to a user through the headphones. The CE device 12 may further include one or more computer memories 28 such as disk-based or solid-state storage that are not transitory signals. Also, in some embodiments, the CE device 12 can include a position or location receiver such as but not limited to a GPS receiver and/or altimeter 30 that is configured to e.g. receive geographic position information from at least one satellite and provide the information to the processor 24 and/or determine an altitude at which the CE device 12 is disposed in conjunction with the processor 24. However, it is to be understood that that another suitable position receiver other than a GPS receiver and/or altimeter may be used in accordance with present principles to e.g. determine the location of the CE device 12 in e.g. all three dimensions.

Continuing the description of the CE device 12, in some embodiments the CE device 12 may include one or more cameras 32 that may be, e.g., a thermal imaging camera, a digital camera such as a webcam, and/or a camera integrated into the CE device 12 and controllable by the processor 24 to gather pictures/images and/or video in accordance with present principles. Also included on the CE device 12 may be a Bluetooth transceiver 34 and other Near Field Communication (NFC) element 36 for communication with other devices using Bluetooth and/or NFC technology, respectively. An example NFC element can be a radio frequency identification (RFID) element.

Further still, the CE device 12 may include one or more motion sensors (e.g., an accelerometer, gyroscope, cyclometer, magnetic sensor, infrared (IR) motion sensors such as passive IR sensors, an optical sensor, a speed and/or cadence sensor, a gesture sensor (e.g. for sensing gesture command), etc.) providing input to the processor 24. The CE device 12 may include still other sensors such as e.g. one or more climate sensors (e.g. barometers, humidity sensors, wind sensors, light sensors, temperature sensors, etc.) and/or one or more biometric sensors providing input to the processor 24. In addition to the foregoing, it is noted that in some embodiments the CE device 12 may also include a kinetic energy harvester to e.g. charge a battery (not shown) powering the CE device 12.

In some examples, the CE device 12 may function in connection with the below-described "master" or the CE device 12 itself may establish a "master", A "master" is used to control multiple ("n", wherein "n" is an integer greater than one) speakers 40 in respective speaker housings, each of can have multiple drivers 41, with each driver 41 receiving signals from a respective amplifier 42 over wired and/or wireless links to transduce the signal into sound (the details of only a single speaker shown in FIG. 1, it being understood that the other speakers 40 may be similarly constructed). Each amplifier 42 may receive over wired and/or wireless links an analog signal that has been converted from a digital signal by a respective standalone or integral (with the amplifier) digital to analog converter (DAC) 44. The DACs 44 may receive, over respective wired and/or wireless channels, digital signals from a digital signal processor (DSP) 46 or other processing circuit.

The DSP 46 may receive source selection signals over wired and/or wireless links from plural analog to digital converters (ADC) 48, which may in turn receive appropriate auxiliary signals and, from a control processor 50 of a master control device 52, digital audio signals over wired and/or wireless links. The control processor 50 may access a computer memory 54 such as any of those described above and may also access a network module 56 to permit wired and/or wireless communication with, e.g., the Internet. The control processor 50 may also access a location module 57. The location module 57 may be implemented by a UWB module made by Decawave or it may be implemented using the Li-Fi principles discussed in one or more of the above-referenced patents or by other appropriate techniques including GPS. One or more of the speakers 40 may also have respective location modules attached or otherwise associated with them. As an example, the master device 52 may be implemented by an audio video (AV) receiver or by a digital pre-amp processor (pre-pro).

As shown in FIG. 1, the control processor 50 may also communicate with each of the ADCs 48, DSP 46, DACs 44, and amplifiers 42 over wired and/or wireless links. In any case, each speaker 40 can be separately addressed over a network from the other speakers.

More particularly, in some embodiments, each speaker 40 may be associated with a respective network address such as but not limited to a respective media access control (MAC) address. Thus, each speaker may be separately addressed over a network such as the Internet. Wired and/or wireless communication links may be established between the speakers 40/CPU 50, CE device 12, and server 60, with the CE device 12 and/or server 60 being thus able to address individual speakers, in some examples through the CPU 50 and/or through the DSP 46 and/or through individual processing units associated with each individual speaker 40, as may be mounted integrally in the same housing as each individual speaker 40.

The CE device 12 and/or control device 52 of each individual speaker train (speaker+amplifier+DAC+DSP, for instance) may communicate over wired and/or wireless links with the Internet 22 and through the Internet 22 with one or more network servers 60. Only a single server 60 is shown in FIG. 1. A server 60 may include at least one processor 62, at least one tangible computer readable storage medium 64 such as disk-based or solid-state storage, and at least one network interface 66 that, under control of the processor 62, allows for communication with the other devices of FIG. 1 over the network 22, and indeed may facilitate communication between servers and client devices in accordance with present principles. Note that the network interface 66 may be, e.g., a wired or wireless modem or router, Wi-Fi transceiver, Li-Fi transceiver, or other appropriate interface such as, e.g., a wireless telephony transceiver.

Accordingly, in some embodiments the server 60 may be an Internet server, may include and perform "cloud" functions such that the devices of the system 10 may access a "cloud" environment via the server 60 in example embodiments. In a specific example, the server 60 downloads a software application to the master and/or the CE device 12 for control of the speakers 40 according to logic below. The master/CE device 12 in turn can receive certain information from the speakers 40, such as their location from a real time location system (RTLS) such as but not limited to GPS or Li-Fi or UWB or other technique, and/or the master/CE device 12 can receive input from the user, e.g., indicating the locations of the speakers 40 as further disclosed below. Based on these inputs at least in part, the master/CE device 12 may execute the speaker optimization logic discussed below, or it may upload the inputs to a cloud server 60 for processing of the optimization algorithms and return of optimization outputs to the CE device 12 for presentation thereof on the CE device 12, and/or the cloud server 60 may establish speaker configurations automatically by directly communicating with the speakers 40 via their respective addresses, in some cases through the CE device 12. Note that if desired, each speaker 40 may include one or more respective one or more light emitting diode (LED) assemblies 68 implementing Li-Fi communication to establish short-range wireless communication among the networked speakers shown. Also, the remote control of the user, e.g., the CE device 12, may include one or more LED assemblies.

As shown, the speakers 40 are disposed in the enclosure 70 such as a room, e.g., a living room. For purposes of disclosure, the enclosure 70 has (with respect to the example orientation of the speakers shown in FIG. 1) a front wall 72, left and right-side walls 74, 76, and a rear wall 78. One or more listeners 82 may occupy the enclosure 70 to listen to audio from the speakers 40. One or microphones 80 may be arranged in the enclosure for generating signals representative of sound in the enclosure 70, sending those signals via wired and/or wireless links to the CPU 50 and/or the CE device 12 and/or the server 60. In the non-limiting example shown, each speaker 40 supports a microphone 80, it being understood that the one or more microphones may be arranged elsewhere in the system if desired.

Because of the portability afforded by wireless configurations, one or more components of the system shown in FIG. 1, such as one or more speakers, may be moved outside the enclosure 70 an outside location 90, such as a patio. Principles described further below can automatically reconfigure speakers based on whether they are inside or outside.

Disclosure below may make determinations using sonic wave calculations known in the art, in which the acoustic waves frequencies (and their harmonics) from each speaker, given its role as a bass speaker, a treble speaker, a subwoofer speaker, or other speaker characterized by having assigned to it a particular frequency band, are computationally modeled in the enclosure 70 and the locations of constructive and destructive wave interference determined based on where the speaker is and where the walls 72-78 are. As mentioned above, the computations may be executed, e.g., by the CE device 12 and/or by the cloud server 60 and/or master 52.

As an example, a speaker may emit a band of frequencies between 20 Hz and 30 Hz, and frequencies (with their harmonics) of 20 Hz, 25 Hz, and 30 Hz may be modeled to propagate in the enclosure 70 with constructive and destructive interference locations noted and recorded. The wave interference patterns of other speakers based on the modeled expected frequency assignments and the locations in the enclosure 70 of those other speakers may be similarly computationally modeled together to render an acoustic model for a particular speaker system physical layout in the enclosure 70 with a particular speaker frequency assignations. In some embodiments, reflection of sound waves from one or more of the walls may be accounted for in determining wave interference. In other embodiments reflection of sound waves from one or more of the walls may not be accounted for in determining wave interference. The acoustic model based on wave interference computations may furthermore account for particular speaker parameters such as but not limited to equalization (EQ). The parameters may also include delays, i.e., sound track delays between speakers, which result in respective wave propagation delays relative to the waves from other speakers, which delays may also be accounted for in the modeling. A sound track delay refers to the temporal delay between emitting, using respective speakers, parallel parts of the same soundtrack, which temporally shifts the waveform pattern of the corresponding speaker. The parameters can also include volume, which defines the amplitude of the waves from a particular speaker and thus the magnitude of constructive and destructive interferences in the waveform. Collectively, a combination of speaker location, frequency assignment, and parameters may be considered to be a "configuration". A configuration may be established to optimize, according to a desired, potentially empirically-determined standard of optimization, acoustic wave constructive and destructive interference for a particular location in the enclosure 70 given the locations of the walls and the various frequencies to be assigned to the various speakers. The particular location(s) may be the expected or actual location of one or more listener, and the EQs, frequency assignments, and delays of the various speakers may be further tailored to the desires or traits of specific individual listeners based on listener profiles.

Figure 2:
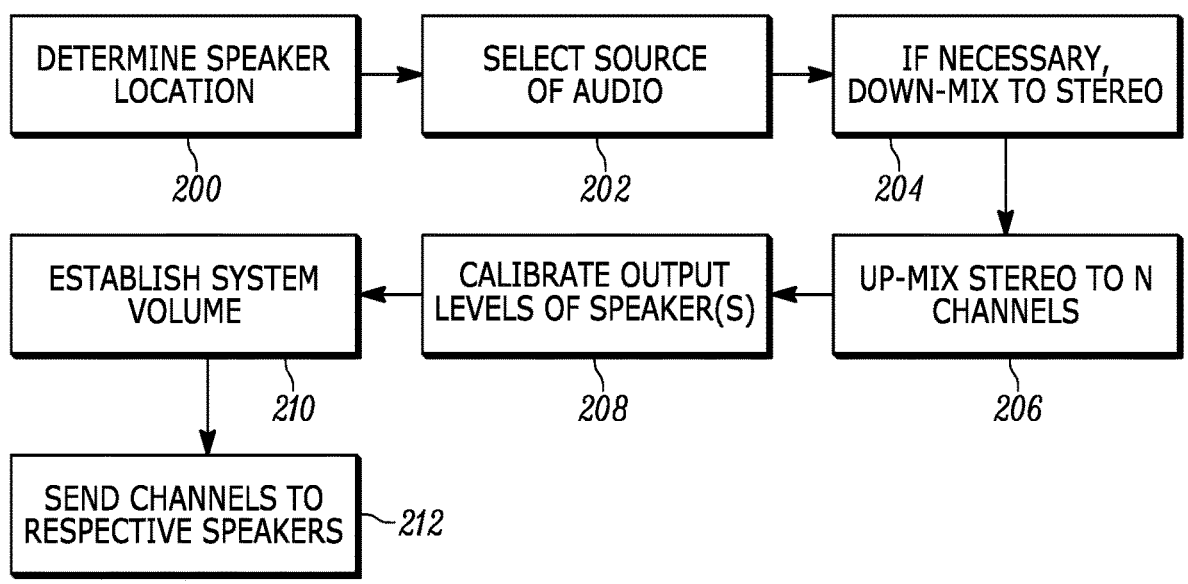
FIG. 2 is a flow chart of example overall logic pertaining to the centralized system in FIG. 1.

The configuration shown in FIG. 1 has a centralized control architecture in which the master device 52 or CE device 12 or other device functioning as a master renders two channel audio into as many channels are there are speakers in the system, providing each respective speaker with its channel. The rendering, which produces more channels than stereo and hence may be considered "up-mixing", may be executed using principles described in the above-referenced rendering references. FIG. 2 describes the overall logic flow that may be implemented using the centralized architecture of FIG. 1, in which most if not all of the logic is executed by the master device.

The logic shown in FIG. 2 may be executed by one or more of the CPU 50, the CE device 12 processor 24, and the server 60 processor 62. The logic may be executed at application boot time when a user, e.g. by means of the CE device 12, launches a control application, which prompts the user to energize the speaker system to energize the speakers 40.

Commencing at block 200, the processor(s) of the master determines room dimension, the location of each speaker in the system, and number of speakers in the room, and the location and if desired identities of each listener in the room. This process is described further below. Moving to block 202, the master selects the source of audio to be played. This may be done responsive to user command input using, e.g., the device 12.

If the input audio is not two channel stereo, but instead is, e.g., seven channel audio plus a subwoofer channel (denoted "7.1 audio"), at block 204 the input audio may be down-mixed to stereo (two channel). The down-mixing may be executed using principles described in the above-referenced rendering references. Other standards for down-mixing may be used, e.g., ITU-R BS.775-3 or Recommendation 7785. Then, proceeding to block 206 the stereo audio (whether received in stereo or down-mixed) can be up-mixed to render "N" channels, where "N" is the number of speaker drivers in the system. Audio can be rendered for each speaker driver based on the respective speaker location (i.e., perimeter, aerial, sub in the x, y, z domain). The up-mixing can be based on the current speaker locations as will be explained further shortly.

Moving to block 208, the channel/speaker output levels are calibrated per description below, preferably based on primary listener location, and then at block 210 system volume is established based on, e.g., room dimensions, number and location of speakers, etc. The user may adjust this volume. At block 212 the master sends the respective audio channels to the respective speakers.

Thus, it may now be appreciated that the speakers 40 do not have to be in a predefined configuration to support a specific audio configuration such as 5.1 or 7.1 and do not have to be disposed in the pre-defined locations of such audio configurations, because the input audio is down-mixed to stereo and then up-mixed into the appropriate number of channels for the actual locations and number of speakers.

Figure 3:
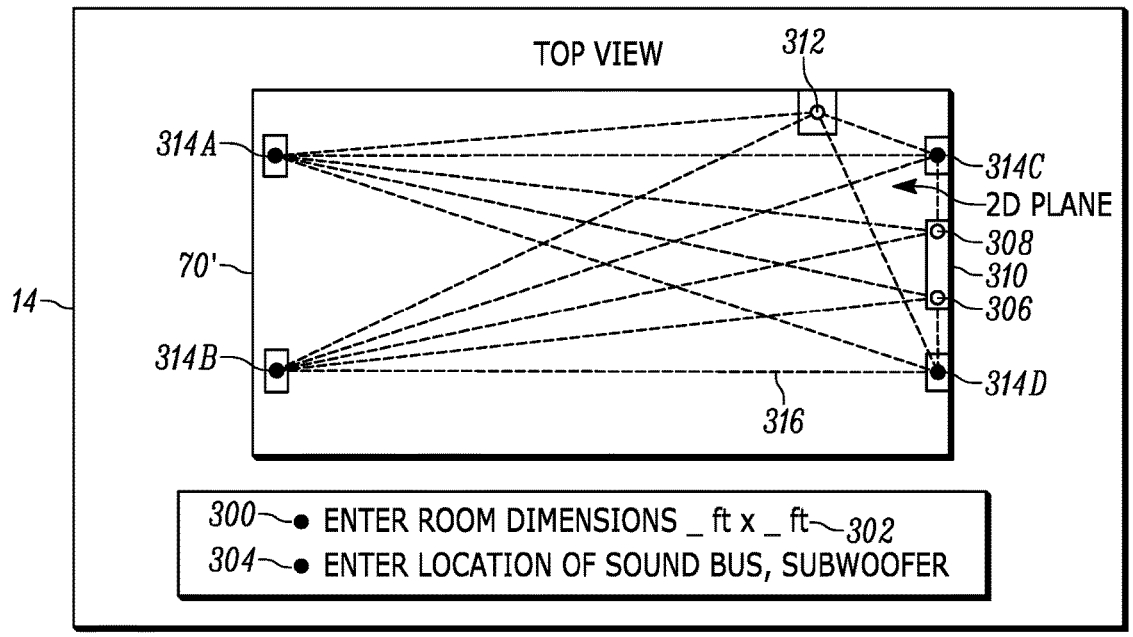
FIG. 3 is a screen shot of an example user interface (UI) that may be presented on a consumer electronics (CE) device to set up speaker location determination.

FIG. 3 illustrates an embodiment in which the dimensions of the enclosure 70 are manually entered by the user, it being understood that automatic means of effecting the same outcome are set forth further below.

Figure 4:
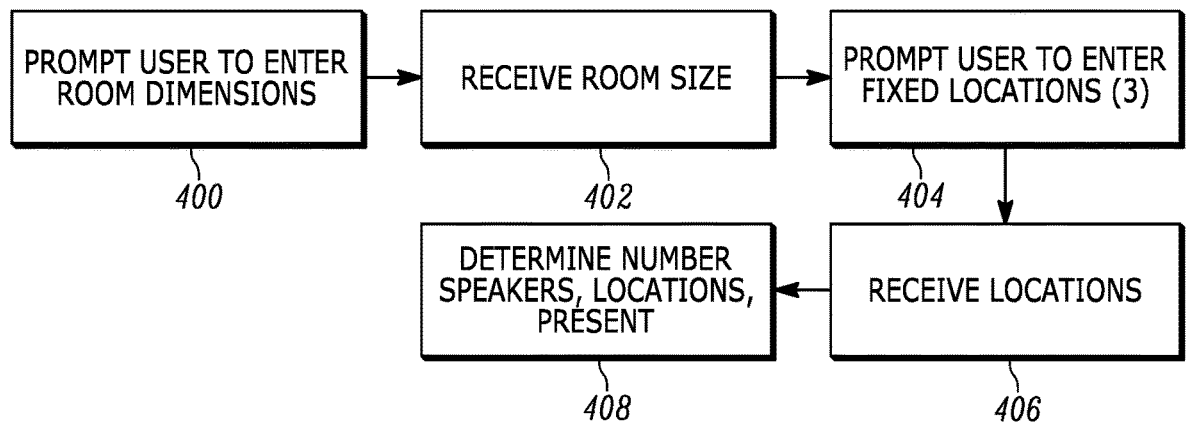
FIG. 4 is a flow chart of example logic for determining speaker locations in a room.

A user interface (UI) may be presented, e.g., on the display 14 of the CE device 12, pursuant to the logic in block 200 of FIG. 2, in the case in which speaker location determination is intended for two dimensions only (in the x-y, or horizontal, plane). FIG. 4 illustrates aspects of logic that may be used with FIG. 3. An application (e.g., via Android, iOS, or URL) can be provided to the customer for use on the CE device 12.

As shown at 300 in FIG. 3 and at block 400 in FIG. 4, the user can be prompted to enter the dimensions of the room 70, an outline 70' of which may be presented on the CE device as shown once the user has entered the dimensions. The dimensions may be entered alpha-numerically, e.g., "15 feet by 20 feet" as at 302 in FIG. 3 and/or by dragging and dropping the lines of an initial outline 70' to conform to the size and shape of the room 70. The application presenting the UI of FIG. 3 may provide a reference origin, e.g., the southwest corner of the room. The room size is received from the user input at block 402 of FIG. 4.

In other embodiments discussed further below, room size and shape can be determined automatically. This can be done by sending measurement waves (such as Li-Fi transmissions from the LEDs) from an appropriate transceiver on the CE device 12 and detecting returned reflections from the walls of the room 70, determining the distances between transmitted and received waves to be one half the time between transmission and reception times the speed of the relevant wave. Or, it may be executed using other principles such as imaging the walls and then using image recognition principles to convert the images into an electronic map of the room.

Moving to block 404, the user may be prompted as at 304 to enter onto the UI of FIG. 3 at least three fixed locations, in one example, the left and right ends 306, 308 of a sound bar or TV 310 and the location at which the user has disposed the audio system subwoofer 312. Four fixed locations are entered for 3D rendering determinations. Entry may be effected by touching the display 14 at the locations in the outline 70' corresponding to the requested components. In a Li-Fi implementation, each fixed location may be associated with a respective Li-Fi LED 68 shown in FIG. 1. The locations are received at block 406 in FIG. 4. The user may also directly input the fact that, for instance, the sound bar is against a wall, so that rendering calculations can ignore mathematically possible calculations in the region behind the wall.

Note that only speakers determined to be in the same room may be considered. Other speakers in other rooms can be ignored. When determining the speaker locations, it may first be decided if a 2D or 3D approach is to be used. This may be done by knowing how many known of fixed locations have been entered. Three known locations yield a 2D approach (all speakers are more or less residing in a single plane). Four known locations yield a 3D approach. Note further that the distance between the two fixed sound bar (or TV) locations may be known by the manufacturer and input to the processor automatically as soon as the user indicated a single location for the sound bar, in some embodiments, the subwoofer location can be input by the user by entering the distance from the sound bar to the subwoofer. Moreover, if a TV is used for two of the fixed locations, the TV may have two locators mounted on it with a predetermined distance between the locators stored in memory, similar to the sound bar. Yet again, standalone location markers such as LEDs or UWB tags can be placed within the room (e.g., at the corner of room, room boundary, and/or listening position) and the distance from each standalone marker to the master entered into the processor.

When communication is established among the speakers in the room 70, at block 408 in FIG. 4 the master device and/or CE device 12 and/or other device implements a location module according to the location determination references above, determining the number of speakers in the room 70 and their locations, and if desired presenting the speakers at the determined locations (along with the sound bar 310 and subwoofer 213) as shown at 314A-D in FIG. 3. The lines 316 shown in FIG. 3 illustrate communication among the speakers 310, 312, 314 and may or may not be presented in the UI of FIG. 3.

In an example "automatic" implementation, a component in the system such as the master device or CE device 12 originates two-way UWB or Li-Fi ranging (or using GPS modules on each speaker). When ranging is used, range and direction to each speaker from the originating device are determined using triangulation and the distance-time-speed algorithm described above. If desired, multiple rounds of two-way ranging can be performed with the results averaged for greater accuracy.

The two-way ranging described above may be affected by causing the CE device 12 (or other device acting as a master for purposes of speaker location determination) to receive a poll message from an anchor point. The CE device 12 sends a response message to the poll message. These messages can convey the identifications associated with each transmitter. In this way, the number of speakers can be known.

The polling anchor point may wait a predetermined period known to the CE device 12 and then send a final poll message to the CE device 12, which can then, knowing the predetermined period from receipt of its response message that the anchor point waited and the speed of the signals, and the time the final message was received, determine the range to the anchor point.

While FIGS. 3 and 4 are directed to finding the locations of the speakers in two dimensions, their heights (elevations) the room 70 may also be determined for a three-dimensional location output. The height of each speaker can be manually input by the user or determined using an altimeter associated with each speaker or determined by implementing a LED 68, e.g., the CE device 12 as three integrated circuits with respective LEDs distanced from each other by known distances, enabling triangulation in three dimensions. Other techniques for finding z-axis locations such as UWB, etc. may be used.

The primary listener location may be then determined according to discussion below. The number of speakers and their locations in the room are now known. Any speakers detected as above that lie outside the room may be ignored. A GUI may be presented on the CE device of the user showing the room and speakers therein and prompting the user to confirm the correctness of the determined locations and room dimensions.

Figure 5:
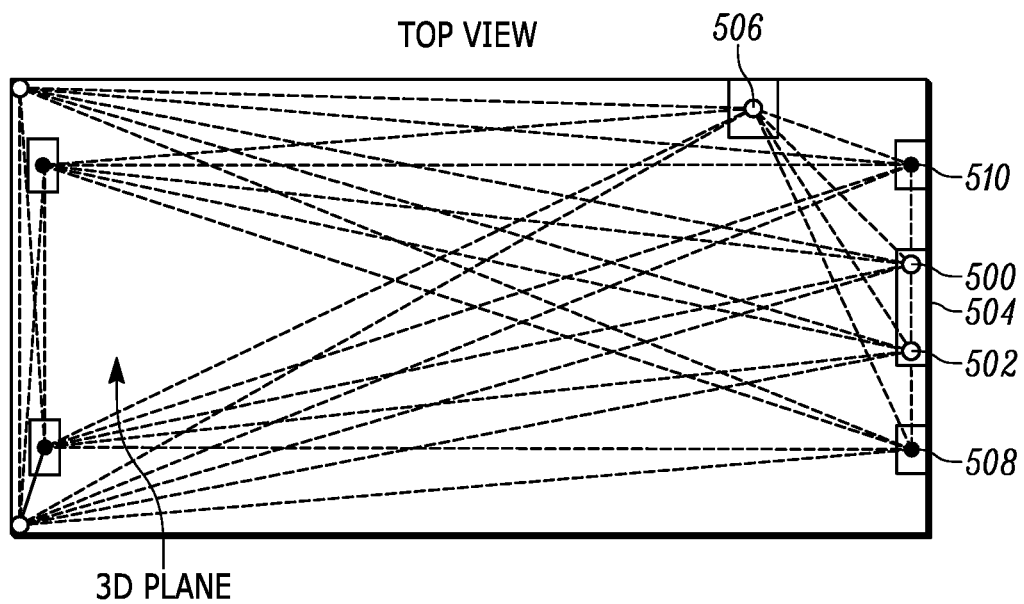
FIGS. 5-7 are additional screen shots of example UIs related to speaker location determination.
Figure 6:
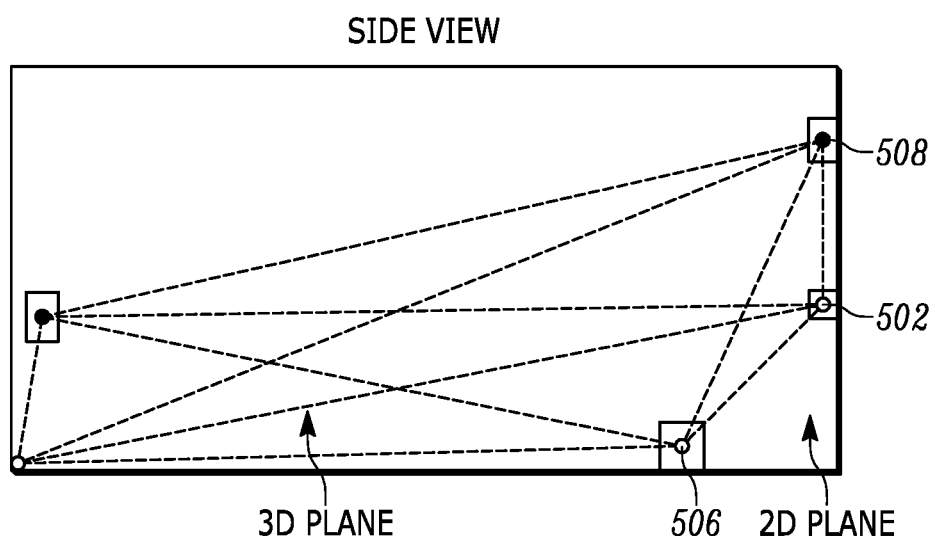

FIGS. 5 and 6 illustrate aspects of an implementation of the 3D location determination. These figures may be presented as UIs on the CE device 12. Four known locations may be provided to determine the location of each speaker in three dimensions. In the example shown in FIG. 5, the user has input the locations 500, 502 associated with a sound bar/TV 504 and the location of the subwoofer 506. The user has also identified (e.g., by touching the display 14 of the CE device 12 at the appropriate locations) two corners 508, 510 of the room 70, preferably corners in which locators such as LEDs 68 have been positioned. Determination of the number of speakers and locations in 3D using triangulation discussed above and the techniques described in the above-referenced location determination references is then made. Note that while FIGS. 5 and 6 respectively show a top view and a side view of the room 70 on the display 14 in two separate images, a single 3D image composite may be presented.

Figure 7:
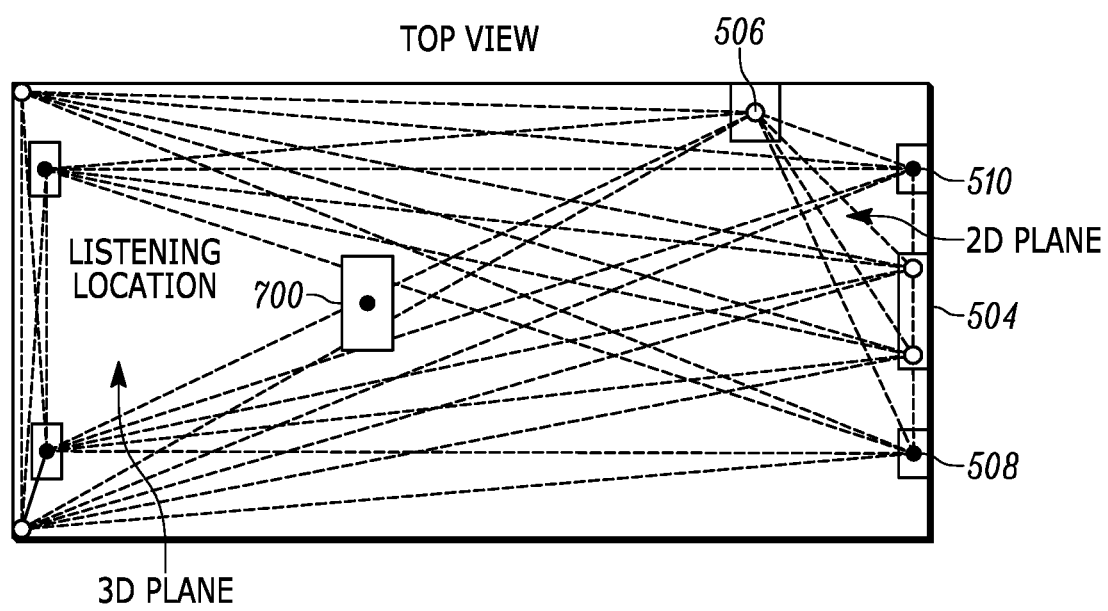

FIG. 7 illustrates yet another UI that can be presented on the CE device 12 in which the user has entered, at 700, the expected location of a listener in the room 700. Or, the location 700 can be automatically determined as described further below using transmissions. Yet again, for purposes of up-mixing according to the rendering references incorporated above, a default location may be assumed, e.g., the geometric center of the room 70, or alternatively about ⅔ of the distance from the front of the room (where the sound bar or TV is usually located) to the rear of the room.

Once the number and locations of the speakers are known, the up mixing at block 206 may be executed using the principles discussed in the above-referenced rendering documents. Specifically, the stereo audio (either as received stereo or resulting from down-mixing of non-stereo input audio at block 204) is up-mixed to, as an example, N.M audio, wherein M=number of subwoofers (typically one) and N=number of speaker drivers other than the sub-woofer. As detailed in the rendering documents, the up-mixing uses the speaker locations in the room 70 to determine which of the "N" channels to assign to each of the respective N speaker drivers, with the subwoofer channel being always assigned to the subwoofer. The listener location 700 shown in FIG. 7 can be used to further refine channel delay, EQ, and volume based on the speaker characteristics (parameters) to optimize the sound for the listener location.

One or more measurement microphones, such as may be established by the microphones 80 in FIG. 1, may be used if available to further calibrate the channel characteristics. This may be made based on information received from the individual speakers/CPU 50 indicating microphones are on the speakers, for example.

If measurement microphones are available, the user can be guided through a measurement routine. In one example, the user is guided to cause each individual speaker in the system to emit a test sound ("chirp") that the microphones 80 and/or microphone 18 of the CE device 12 detect and provide representative signals thereof to the processor or processors executing the logic, which, based on the test chirps, can adjust speaker parameters such as EQ, delays, and volume.

The example above uses a centralized master device to up-mix and render each of the "N" audio channels, sending those channels to the respective speakers. When wireless connections are used, and bandwidth is limited, a distributed architecture may be used, in which the same stereo audio from a master is sent to each speaker, and each speaker renders, from the stereo audio, its own respective channel. Details of this alternative architecture are set forth in the above-referenced U.S. Pat. No. 9,826,332.

In determining distances using ranging, one or more measurement signals such as light beams may be transmitted, and reflections received. To determine distance the following equation may be used:

$$D=c(t_1-t_0)$$

where c=speed of light, $t_1$ is time of receipt, and $t_0$ is time of transmission.

It may then be assumed that for each receiver, the distance to the wall closest to that receiver a midpoint of a projected planar surface. The midpoints may be communicated to a determination processor (which may be implemented by any of the processors herein) which projects respective planes from each midpoint. The projected planar surfaces will intersect each other with the intersections defining the corners of the enclosure 70 and the portions of the projected planes within the corners defining the walls of the enclosure.

The above is but one simplified method for mapping the wall locations of the enclosure 70. More complex methods may be used. For example, the process above can be repeated multiple times to refine the wall locations. Additional reflections after time $t_1$ at each receiver may also be used to ascertain whether a receiver's initial reflection is indeed from a wall or from an intervening object. Or, the transmitting assembly may be mounted on a gimbal to send multiple transmissions at multiple orientations such that the reflections detected by the receivers at some orientations may be received sooner than reflections received at other orientations, with the further reflection being assumed to be a wall and the earlier reflection assumed to be from an intervening object between the receiver and wall. Instead of a gimbal to steer the transmitting assembly, a micro-electrical mechanical system (MEMS) may be used.

Yet again, in embodiments in which each location assembly knows its location and the locations of other assemblies by virtue of GPS information being communicated between the assemblies or by other means (e.g., manual location entry by an installer), the locations of the assemblies may be used in the computation of wall locations to ferret out false indications of wall locations arising from reflections from intervening objects. Yet again, it may be assumed, for the same purpose that each receiver is more or less at the same distance from its closest wall as the opposite receiver.

Yet again, a combination of manual and automatic mapping may be used. For instance, a user may be presented with a UI such as those described above to indicate the locations of the walls of the enclosure, with subsequent reflections determined to have come from the walls based on the known locations of the LED assemblies being ignored and other reflections being inferred to be from intervening objects such as listeners or audio speakers. Similarly, the user may use a touch display to touch a presentation of an estimated model of the enclosure to indicate where audio speakers and/or listeners are, with reflections from those locations being ignored by the LED assemblies and other reflections inferred to be from the walls, thereby refining the map of the enclosure.

Note that when mapping, reflections indicating locations in the same flat plane, potentially satisfying a size criteria that discriminates between larger walls and smaller rectangular objects, may be mapped as walls of the enclosure. That is, feature recognition may be used to recognize that a series of reflections at a given receiver or receivers all lie in the same plane, and that the plane is sufficiently large to be inferred to be a wall. In addition, or alternatively, the feature recognition may be based on the type of reflection received. For example, it may be assumed that a strong reflection (higher amplitude) comes from a hard speaker surface, whereas a less strong reflection comes from a matte-painted wall. Other feature vectors may be used. Return signal characteristics may be, as discussed above, an exceptionally high amplitude as may be reflected by reflectors or tags engaged with the audio speakers. In contrast other points of reflection with a second type of return signal characteristic may be mapped as human listener locations. The second type of return signal characteristic may be a relatively low amplitude reflection signal as may be produced by a surface such as human skin that is softer than an audio speaker or a wall.

Figure 8:
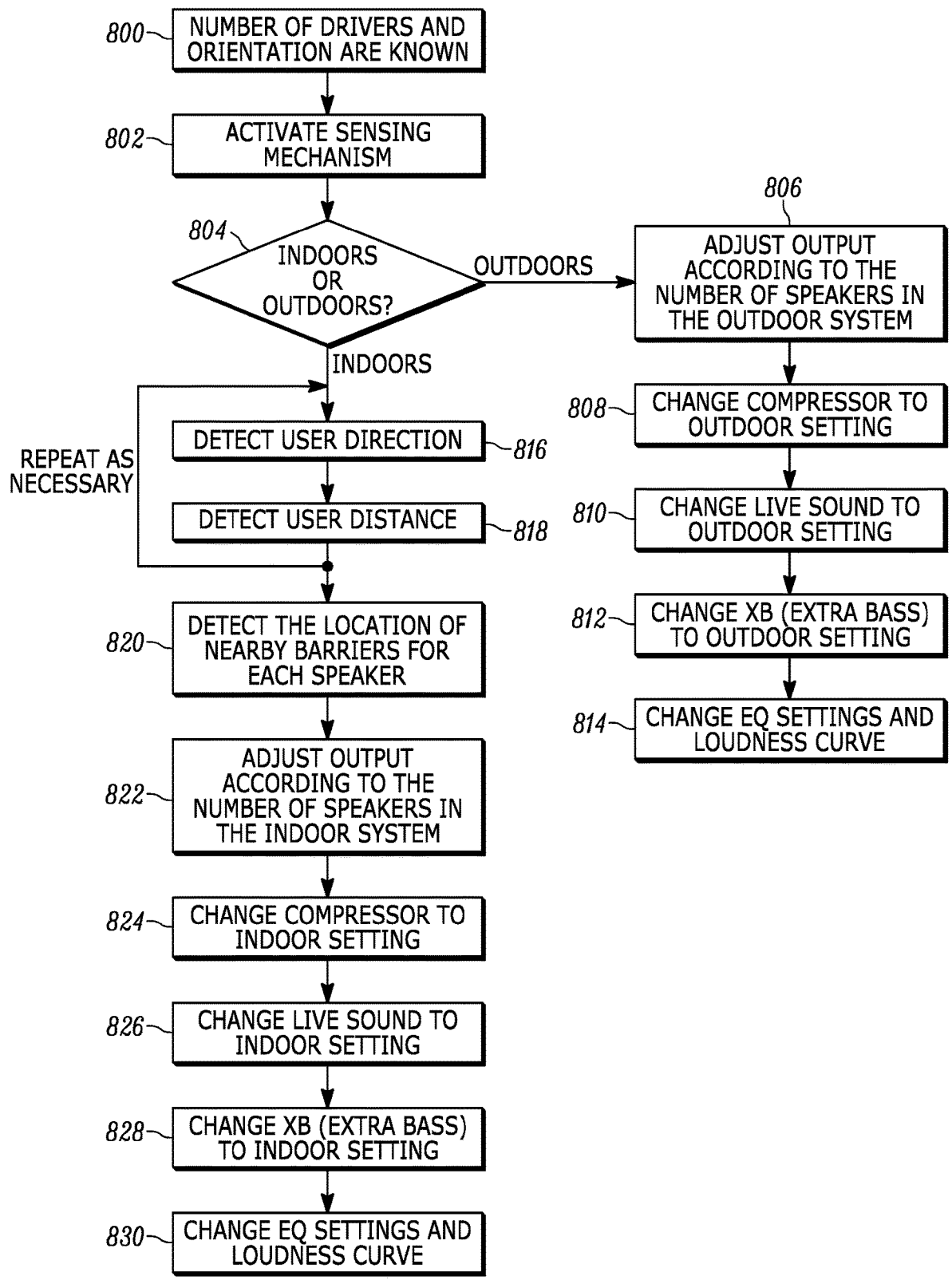
FIG. 8 is a flow chart of example logic for establishing audio speaker system configurations based on whether speakers are indoors or have been moved outdoors.

FIG. 8 illustrates logic for establishing audio configurations in a speaker system depending on whether the system is indoors or outdoors. Commencing at block 800, the number of speaker drivers and their orientations (i.e., axis of sound cone projected by the associated speaker, in 3D if desired) are identified. This may be done using any of the techniques described above, e.g., by receiving user input of this information during setup or using any of the automatic methods described herein. Note that some speakers may have multiple drivers for a greater than stereo effect. Speaker driver configuration is discussed further below.

Moving to block 802, a sensing mechanism is monitored, if need be by first activating it, for determining whether part or all of the speaker system is indoors or outdoors. Activation may be initiated by, e.g., tapping or double tapping an audio system component such as any described herein or moving, if desired in a certain way, an audio system component such as any described herein, with such movement being sensed and correlated to "activate indoor/outdoor determination".

In one example, activation can entail activating a microphone such as any of the microphones described herein to receive a voice command indicating "indoor" or "outdoor". In another example this can entail activating a microphone such as any of the microphones described herein to receive a voice command indicating that any of the processors described herein is to automatically determine whether the audio system is indoors or outdoors.

A number of techniques may be used to do this. For example, signals from one or more light sensors on or near respective speakers can be received, indicating illumination levels correlated with indoors (typically lower levels) or outdoors (typically higher levels for daytime and lower than indoors for night). Or, signals from one or more microphones on or near respective speakers can be received, digitized, and compared against a database of audio fingerprints to determine whether sounds are being received such as bird chirps that are correlated to outdoors or cooking sounds normally correlated to indoors, etc. As further examples, signals from one or more moisture sensors on or near respective speakers can be received, with relatively higher moisture levels indicating outdoors and relatively lower moisture levels indicating indoors. Still further, signals from one or more cameras on or near respective speakers can be received, digitized, and using image recognition compared against a database of images that correlates some images (such as of stars, trees, etc.) to outdoors and other images (such as walls, kitchen appliances, etc.) to indoors.

Figure 13:
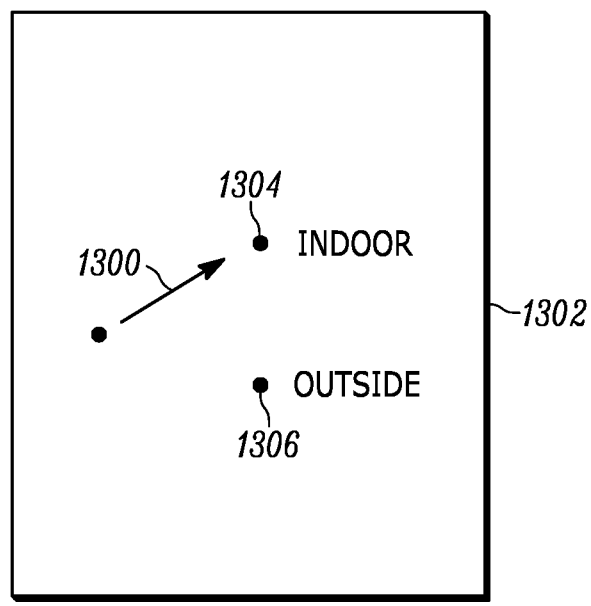
FIG. 13 schematically illustrates a switch on an audio system component for selecting between indoor and outdoor settings.

Yet again, briefly referring to FIG. 13, a mechanical switch 1300 can be provided on an audio system component 1302 such as any of the audio system components described herein, and can be manipulated to indicate indoors (by, e.g., moving the switch to an "indoor" position 1304) or outside or outdoors (by, e.g., moving the switch to an "outside" position 1306).

Figure 14:
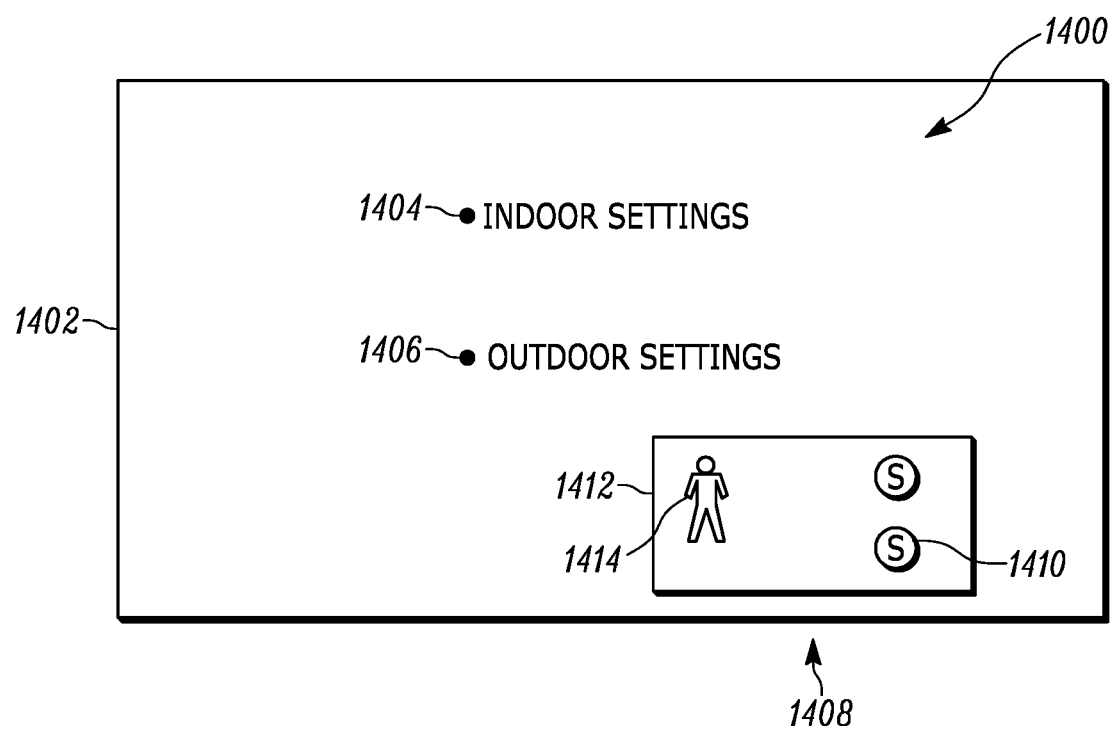
FIG. 14 is a screen shot of an example user interface for selecting between indoor and outdoor settings.

Or, briefly referring to FIG. 14, a user interface 1400 may be presented on an audio system display 1402 such as any described herein with an indoor selector 1404 and an outside or outdoors selector 1406, with one of the selectors 1404, 1406 being selectable to establish whether the system should be configured with indoor or outdoor settings as described below. If desired, as shown in FIG. 14 when indoor 1404 is selected, a depiction 1408 may be presented showing icons 1410 of speakers and their locations relative to walls 1412 of the room in which they are located. Icons 1414 may also be presented showing locations of listeners in the room. Combinations of the above techniques may be used to indicate indoors or outdoors. For example, sensed movement of a device such as a speaker may be followed by a voice command to confirm or decline an identification of "indoors" or "outdoors" and corresponding speaker calibration.

Returning to FIG. 8, decision diamond 804 is used to indicate that if "outdoors" is determined, logic advances to block 806 et seq. to automatically establish audio settings for the system appropriate for outdoor operation, whereas if "indoors" is determined, logic advances to block 816 et seq. to establish audio settings for the system appropriate for indoor operation.

At block 806, audio channels are established according to how many speakers are in the outdoor environment. If only a single speaker is outdoors, input audio (e.g., stereo) is converted to mono and played on the sole outdoor speaker. If two speakers are outdoors, stereo is output for play of one channel on one of the speakers and the other channel on the other speaker. If three speakers are outdoors, input audio, if stereo, for example, is converted to left, center, and right channels for play of the three channels on the three respective speakers. Similarly, if four speakers are outdoors, input audio, if stereo, for example, is converted to four channels (for example, left front, right front, left rear, right rear) for play of the four channels on the four respective speakers. In general, input stereo may be up-converted to N-channel audio for play on N outdoors speakers.

Moving to block 808, dynamic audio compression (in some examples, implemented by an audio compressor) is set to an outdoor value. Audio compression is a signal processing operation that reduces the volume of loud sounds or amplifies quiet sounds thus reducing or compressing an audio signal's dynamic range. For outdoor operation, low compression relative to the value that would be set for indoor operation may be used because ambient noise out of doors may typically be higher than quieter ambient atmosphere indoors. Other settings heuristics may be used.

Proceeding to block 810, "live sound", the amount of ambient noise that is processed relative to the primary demanded audio, is set to a value appropriate for outdoor operation. An example value would be a setting to process less ambient noise when outdoors than when in an indoor environment. At block 812 an extra base audio setting may be established at a value appropriate for outdoor operation. For example, more extra bass (higher value) may be established for outdoor operation than would be established for indoor operation. Likewise, at block 814 an equalization (EQ) setting value and loudness curve may be established that is more appropriate for outdoor operation. As an example, an EQ value that results in more bass compared to treble than an EQ value that results in relatively less bass compared to treble may be established for outdoor operation, with an EQ value that results in relatively less bass compared to treble may be established for indoor operation. A loudness curve more appropriate for outdoor operation also may be established.

On the other hand, when indoor operation is identified at decision diamond 804, the logic may move to block 816 to determine the direction from a user (listener) to the audio system or a speaker thereof (such as the center channel speaker). At block 818 the distance between the user (listener) and system or audio speaker may also be determined.

Locations of nearby barriers such as walls may be determined at block 820, if desired for each indoor speaker.

Blocks 822-830 are analogous to blocks 806-814 described above, except that indoor setting values are established in blocks 822-830. Thus, at block 822 audio channels are established according to how many speakers are in the indoor environment. Moving to block 824, dynamic audio compression (in some examples, implemented by an audio compressor) is set to an indoor value. Proceeding to block 826, "live sound" is set to a value appropriate for indoor operation. At block 828 an extra base audio setting may be established at a value appropriate for indoor operation. For example, less extra bass (lower value) may be established for indoor operation than would be established for outdoor operation. Likewise, at block 830 an equalization (EQ) setting value and loudness curve may be established that are more appropriate for indoor operation.

FIGS. 9-12 illustrate additional principles that may be implemented for indoor operation. Commencing at block 900, the number of speaker drivers and their orientations (i.e., axis of sound cone projected by the associated speaker, in 3D if desired) are identified. This may be done using any of the techniques described above, e.g., by receiving user input of this information during setup or using any of the automatic methods described herein. Note that some speakers may have multiple drivers for a greater than stereo effect. Speaker driver configuration is discussed further below.

Moving to block 902, a sensing mechanism is monitored, if need be by first activating it, for determining whether part or all of the speaker system is indoors or outdoors. Activation may be initiated by, e.g., tapping or double tapping an audio system component such as any described herein or moving, if desired in a certain way, an audio system component such as any described herein, with such movement being sensed and correlated to "activate indoor/outdoor determination".

Assuming that "indoor" is identified at block 902, the logic moves to block 904. At block 904 locations of nearby barriers such as walls may be determined, if desired for each indoor speaker, as discussed above in relation to block 820 of FIG. 8 and description of wall location identification in FIGS. 1-7. Proceeding to block 906, the speaker drivers are adjusted, for each speaker if desired, such that the center channel audio cone, i.e., direction in which the center channel is broadcast from the speaker, faces a first direction, in this case, away from the closest barrier to the speaker. The left and right channels are then adjusted accordingly at block 908 to emit sound to the left and right of the new direction of the center channel.

Figure 10:
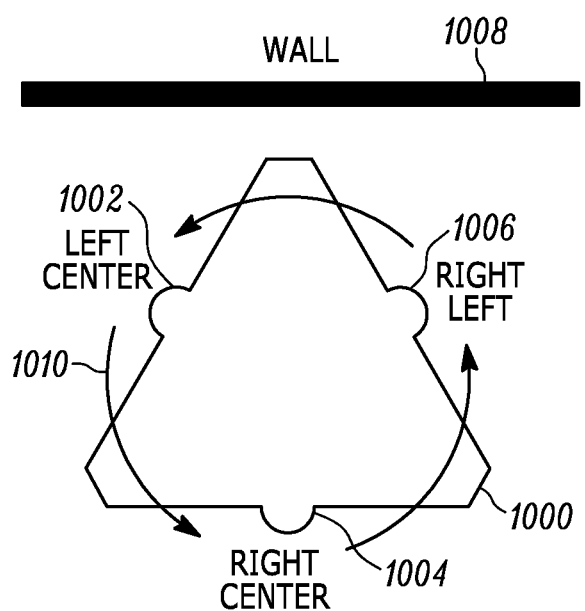
FIG. 10 is a schematic top plan view of a room illustrating principles of FIG. 9.

FIG. 10 illustrates. An audio speaker 1000 may have multiple drivers 1002, 1004, 1006 for a greater than stereo effect. In the example shown, the speaker 1000 has three perimeter drivers, i.e., the perimeter drivers are in the same horizontal or x-y plane. It is to be understood that the speaker 1000 may also have three height drivers as well, i.e., three drivers arranged in a vertical plane.

As shown, responsive to a nearest wall 1008 being detected, the left channel driver 1002 is moved as indicated by the arrow 1010 to be the center channel driver which projects center channel sound outward along a sonic axis oriented directly away from the wall 1008. The other arrows in FIG. 10 indicate that the formerly center channel is rotated to the right and the former right channel is rotated to be the left channel driver. Similar principles may be used for height drivers, with up-rendering used to create height. In general, N-channel audio is created to match the number of N drivers. Note that EQ change can include crossover frequencies for each particular driver, and that the height crossover frequencies may be different from the perimeter crossover frequencies.

The above rotation may be affected by mounting the speaker 1000 on a vertically-oriented axle and rotating the axle using a motor such as a DC stepper motor. Or, the rotation may be affected electronically, by shifting center channel audio from one otherwise stationary driver to another otherwise stationary driver to establish the channel directionality described above.

Figure 11:
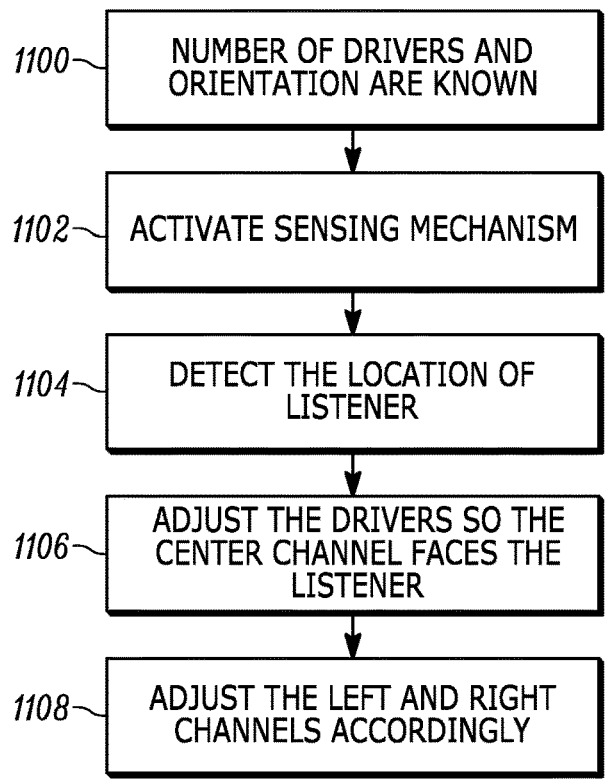
FIG. 11 is a flow chart of example logic for adjusting speaker drivers based on listener location in a room.
Figure 12:
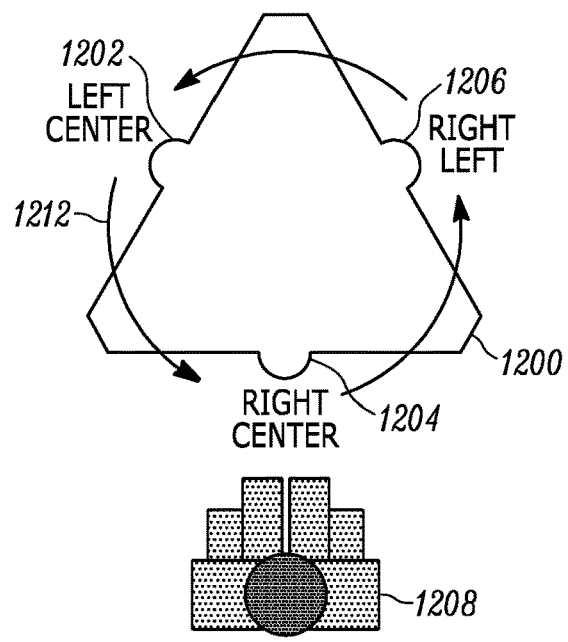
FIG. 12 is a schematic top plan view of a room illustrating principles of FIG. 11.

FIGS. 11 and 12 illustrate that alternative to directing the center channel sound axis away from a wall, it may be directed toward a listener. Commencing at block 1100, the number of speaker drivers and their orientations (i.e., axis of sound cone projected by the associated speaker, in 3D if desired) are identified in accordance with disclosure above. Moving to block 1102, a sensing mechanism is monitored, if need be by first activating it, for determining whether part or all of the speaker system is indoors or outdoors. Assuming that "indoor" is identified at block 1102, the logic moves to block 1104. At block 1104 locations of a nearby listener is identified, if desired for each indoor speaker (in which case the listener of multiple detected listeners who is closest to the speaker is selected for that speaker). For example, information from blocks 816 and 818 as discussed above in relation to block 820 of FIG. 8 and description of listener location identification in FIGS. 1-7 may be used.

Figure 9:
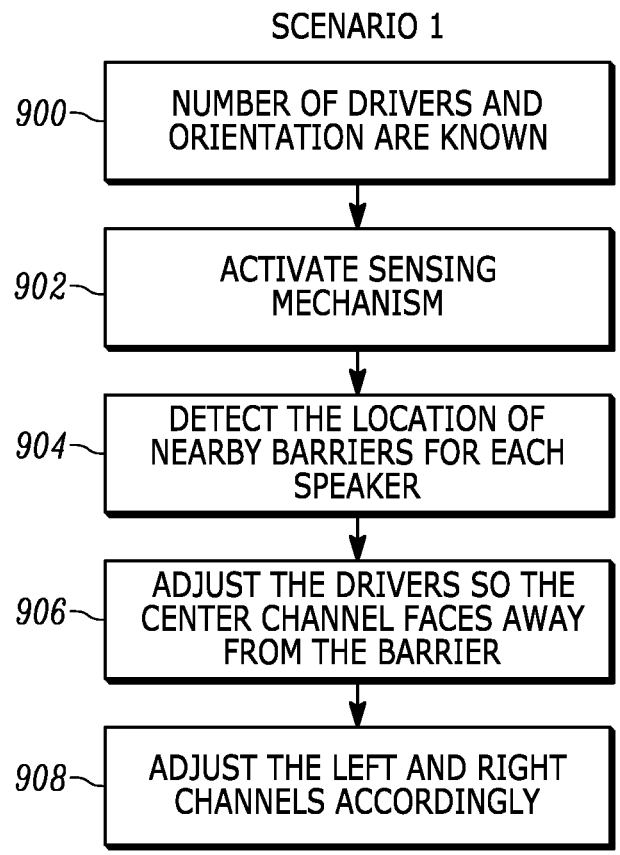
FIG. 9 is a flow chart of example logic for adjusting speaker drivers based on sound barriers in a room.

Proceeding to block 1106, the speaker drivers are adjusted, for each speaker if desired, such that the center channel audio cone, i.e., direction in which the center channel is broadcast from the speaker, faces a second direction different from the first direction used for the wall test of FIGS. 9 and 10, in this case, toward the listener. The left and right channels are then adjusted accordingly at block 1108 to emit sound to the left and right of the new direction of the center channel.

FIG. 12 illustrates. An audio speaker 1200 may have multiple drivers 1202, 1204, 1206 for a greater than stereo effect. In the example shown, the speaker 1200 has three perimeter drivers, i.e., the perimeter drivers are in the same horizontal or x-y plane. It is to be understood that the speaker 1200 may also have three height drivers as well, i.e., three drivers arranged in a vertical plane.

As shown, responsive to a nearest listener 1208 being detected, the left channel driver 1202 is moved as indicated by the arrow 1210 to be the center channel driver which projects center channel sound outward along a sonic axis oriented directly toward the listener 1208. The other arrows in FIG. 12 indicate that the formerly center channel is rotated to the right and the former right channel is rotated to be the left channel driver. Similar principles may be used for height drivers, with up-rendering used to create height. In general, N-channel audio is created to match the number of N drivers, Note that EQ change can include crossover frequencies for each particular driver, and that the height crossover frequencies may be different from the perimeter crossover frequencies.

While particular techniques are herein shown and described in detail, it is to be understood that the subject matter which is encompassed by the present invention is limited only by the claims.

What is claimed is:
1. A device comprising:
at least one computer medium that is not a transitory signal and that comprises instructions executable by at least one processor to:

identify whether at least a first audio speaker is located inside a building or outdoor;

responsive to identifying that the first audio speaker is located inside a building, establish a first value of at least a first audio setting of the first audio speaker;

responsive to identifying that the first audio speaker is located outdoor, establish a second value of the first audio setting of the first audio speaker;

responsive to identifying that the first audio speaker is located inside a building, identify a location of at least one listener; and establish a speaker driver orientation such that a center channel of N-channel audio produced by plural speakers in the building is directed toward the listener.

2. A device comprising:

at least one computer medium that is not a transitory signal and that comprises instructions executable by at least one processor to:

identify whether at least a first audio speaker is located inside a building or outdoor;

responsive to identifying that the first audio speaker is located inside a building, establish a first value of at least a first audio setting of the first audio speaker;

responsive to identifying that the first audio speaker is located outdoor, establish a second value of the first audio setting of the first audio speaker;

responsive to identifying that the first audio speaker is located inside a building, identify a location of at least one barrier in the building; and establish a speaker driver orientation such that a center channel of N-channel audio produced by plural speakers in the building is directed away from the barrier.

3. A method, comprising:

receiving indication of whether at least a first speaker is located inside a building;

responsive to identifying that the first speaker is located inside the building, identifying a location of at least one listener; and establishing a speaker driver orientation such that a center channel of N-channel audio produced by plural speakers in the building is directed toward the listener.

4. A method, comprising:

receiving indication of whether at least a first speaker is located inside a building;

responsive to identifying that the first speaker is located inside the building, identifying a location of at least one barrier in the building; and establishing a speaker driver orientation such that a center channel of N-channel audio produced by plural speakers in the building is directed away from the barrier.

5. An audio speaker system, comprising:

at least a first audio speaker associated with a first speaker driver; and at least one processor configured with instructions for:

establishing a first audio configuration of the first audio speaker responsive to receiving indication that the first audio speaker is located inside a building;

establishing a second audio configuration of the first audio speaker responsive to receiving indication that the first audio speaker is located outdoors; and establishing an orientation of a speaker driver orientation responsive to identifying that the first audio speaker is located inside a building based on a listener location or a barrier location.

6. The audio speaker system of claim 5, wherein the instructions are executable for:

establishing the orientation of the speaker driver orientation responsive to identifying that the first audio speaker is located inside a building based on a listener location.

7. The audio speaker system of claim 5, wherein the instructions are executable for:

establishing the orientation of the speaker driver orientation responsive to identifying that the first audio speaker is located inside a building based on a barrier location.

* * * * *